United States Patent [19]
Baker et al.

[11] Patent Number: 5,068,625
[45] Date of Patent: Nov. 26, 1991

[54] METHOD FOR FAST FREQUENCY ACQUISITION IN A PHASE LOCKED LOOP

[75] Inventors: James C. Baker, Hanover Park; Michael J. Carney, Schaumburg, both of Ill.

[73] Assignee: Motorola, Inc., Schaumburg, Ill.

[21] Appl. No.: 627,171

[22] Filed: Dec. 14, 1990

[51] Int. Cl.$^5$ .................................... H03L 7/085
[52] U.S. Cl. ................................ 331/1 A; 331/17; 331/25
[58] Field of Search ........................ 331/1 A, 17, 25

[56] References Cited
U.S. PATENT DOCUMENTS
4,972,160 11/1990 Sylvain ..................... 331/1 A Primary Examiner—David Mis
Attorney, Agent, or Firm—Kenneth W. Bolvin

[57] ABSTRACT

The method of the present invention provides fast frequency acquisition in a PLL. The peak voltage for a phase error signal is detected at time $t_p$ and a voltage controlled oscillator warp voltage is sampled at $t_p$. The new warp voltage to the voltage controlled oscillator is set to what the warp voltage was at $t_p$. The bandwidth of the loop is then narrowed and the warp voltage is averaged over a number of samples. The warp voltage is then set to the average warp voltage and the loop bandwidth is widened.

6 Claims, 4 Drawing Sheets

FIG.2 *Laplace Domain Representation of Frequency Correction Loop*

METHOD FOR FAST FREQUENCY ACQUISITION IN A PHASE LOCKED LOOP

FIELD OF THE INVENTION

The present invention relates generally to the field of communications and particularly to phase locked loops used in digital communications.

BACKGROUND OF THE INVENTION

When a mobile radiotelephone is handed off from one radiotelephone cell to another, it typically must change from the frequency that was used in the old cell to a new frequency that will be used in the new cell. This hand-off takes place while the radiotelephone is in a call, and therefore must be done quickly enough to avoid a drop in the audio signal. This drop will cause a gap in conversation in the call. The U.S. Digital Cellular specifications require that the frequency difference between the receiver and the incoming signal be within ±200 Hz. The receiver, therefore, must quickly lock onto the new frequency to stay within these limits.

A phase locked loop (PLL) is typically used in the radiotelephone to change from one frequency to another. PLLs are discussed in A. Blanchard, *Phase Locked Loops: Application to Coherent Receiver Design* 281-292 (1976) and F. Gardner, *Phaselock Techniques* (1979). One method for decreasing the PLLs lock time is to use an adaptive bandwidth filter to narrow the signal's bandwidth when the phase error crosses the zero axis. The problem with this method, however, is that it takes a relatively large amount of time for the voltage controlling the voltage controlled oscillator (VCO), the warp voltage, to reach zero. There is a resulting need for a method to greatly reduce the time for a PLL to lock onto a frequency.

SUMMARY OF THE INVENTION

The method of the present invention provides fast frequency acquisition in a PLL. The PLL being comprised of a frequency detector that outputs an error signal, an integrating filter that converts the frequency error to a phase error, a loop filter that outputs a warp voltage, and a VCO that is controlled by the warp voltage. The peak voltage for the phase error signal is detected at time $t_p$ and the warp voltage is sampled at $t_p$. The warp voltage to the VCO is set to what the warp voltage was at $t_p$. The bandwidth of the loop is then narrowed and the warp voltage is averaged over a number of samples. The warp voltage is then set to the average warp voltage and held there.

DETAILED DESCRIPTION OF THE PREFERRED EMBODIMENT

The frequency acquisition method of the present invention greatly reduces the time required for a communication receiver to lock onto the frequency of an incoming signal. By detecting the peak voltage of the phase error and the voltage of the warp voltage at the time of this peak, the PLL's VCO can be reset to this warp voltage, thereby greatly reducing the lock time.

Figure 1:
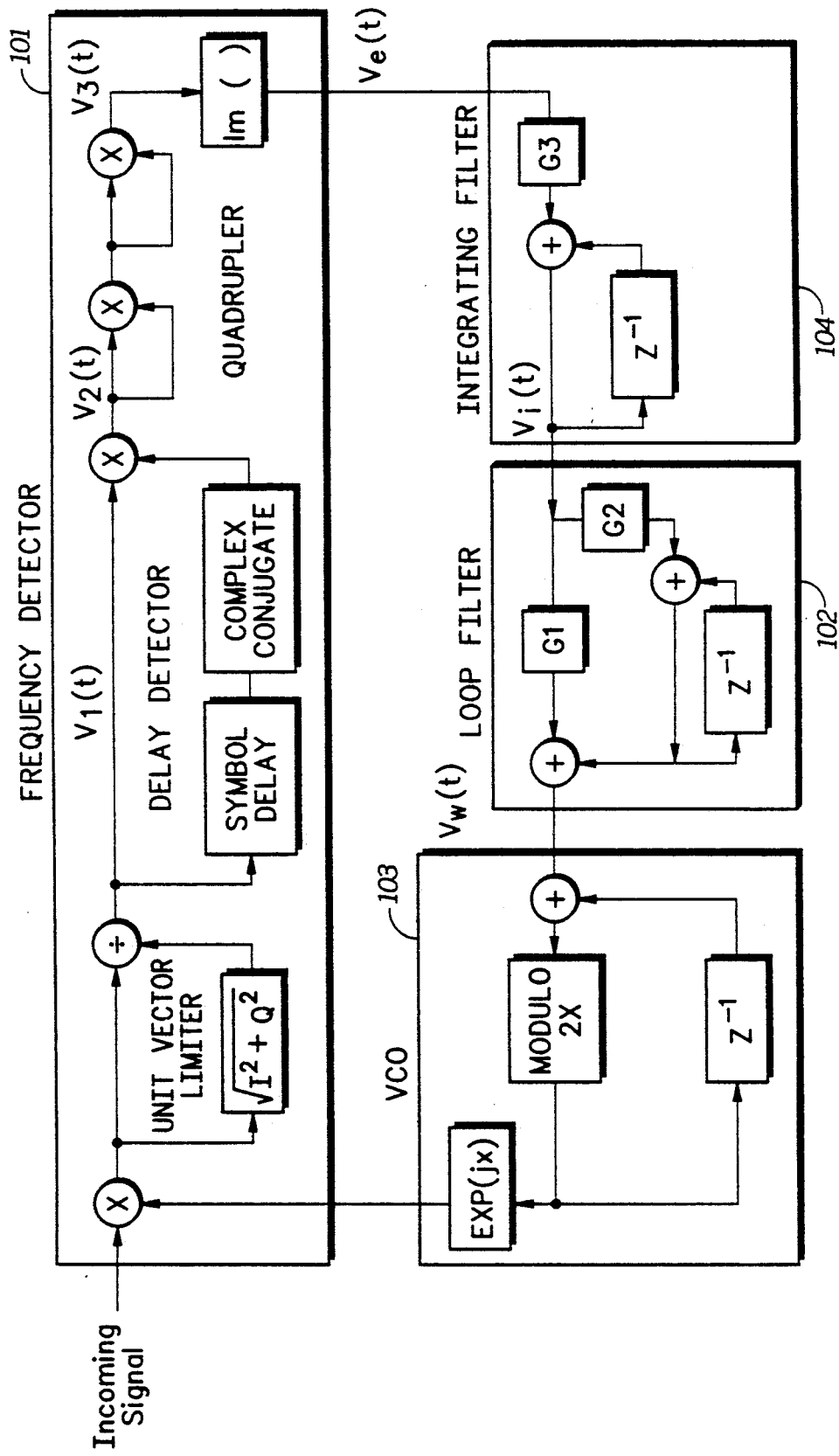
FIG. 1 shows a block diagram of a phase locked loop of the present invention.

The PLL of the present invention, illustrated in FIG. 1, is comprised of the frequency detector (101), a loop filter (102), an integrating filter (104), and a VCO (103). The frequency detector (101) generates an error signal, $V_e(t)$. This signal is converted to a phase error by the integrating filter (104). The loop filter (102) integrates the phase error signal, generating the warp voltage. The warp voltage controls the frequency of the VCO (103). The various voltages of the PLL with reference to FIG. 1, are as follows:

$$v_1(t) = e^{j(\Delta \omega t_1 + \theta t_1)}$$

$$v_2(t) = e^{j(\Delta \omega (t_1 - t_2) + \theta t_1 - \theta t_2)}$$

$$v_3(t) = (-1)e^{j(\Delta \omega (t_1 - t_2))}$$

Figure 2:
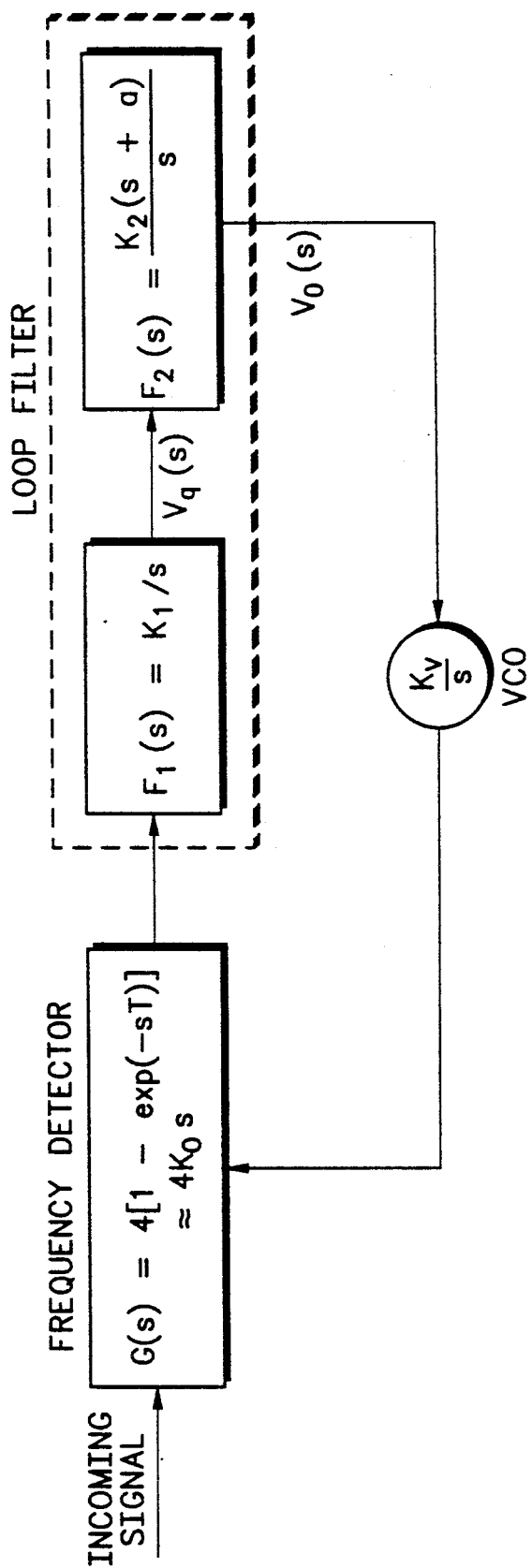
FIG. 2 shows the Laplace domain representation of the phase locked loop of the present invention.

The Laplace domain representation of the PLL is illustrated in FIG. 2. A derivation of the frequency detector characteristic function is as follows:

$$v_e(t) = Im\{e^{j4(\theta_1(t) - \theta_1(t - T_s) - \theta_2(t) + \theta_2(t - T_s))}\} = \sin\{4(\theta_1(t) - \theta_1(t - T_s) - \theta_2(t) + \theta_2(t - T_s))\}.$$

After linearizing the loop and transforming to the Laplace domain, $$V_e(s) = 4\theta_1(s) - 4e^{-sT_s}\theta_1(s) - 4\theta_2(s) + 4e^{-sT_s}\theta_2(s)$$

$$= 4(1 - e^{-sT_s})\{\theta_1(s) - \theta_2(s)\}$$

where $\theta_2(s) = V_o(s)\dfrac{K_v}{s}$.

Therefore, $$\frac{V_o(s)}{F(s)} = V_e(s) = 4\theta_1(s) -$$

$$4e^{-sT_s}\theta_1(s) - 4V_o(s)\frac{K_v}{s} + 4e^{-sT_s}V_o(s)\frac{K_v}{s}.$$

Equating $V_o(s)$ to $s\theta_2(s)/K_v$, the closed loop response becomes $$\frac{\theta_2(s)}{\theta_1(s)} = \frac{4K_vF(s)[1 - e^{-sT_s}]}{\{s + 4F(s)K_v[1 - e^{-sT_s}]\}}.$$

The detector can be approximated by the term $4K_o s$, where $K_o$ is a gain constant. Because conventional phase detectors are characterized by a constant in the Laplace domain, a pole was introduced by the integrating filter (104) as $F_1(s) = K_1/s$. The second stage of the loop filter is the active integrator denoted by $F_2(s)$. In response to a step change in frequency by the incoming signal, the error signal, $V_e(t)$, will be driven towards zero. Since $V_i(t)$ is the integral of the error signal, $F_1(s)$ will produce a pulse at its output. The pulse will peak when the error signal changes polarity and the amplitude of the pulse will be proportional to the frequency offset. The filter, $F_2(s)$, will integrate this pulse to produce the desired step response voltage, $V_{warp}(t)$, to control the VCO output frequency.

Figure 3:
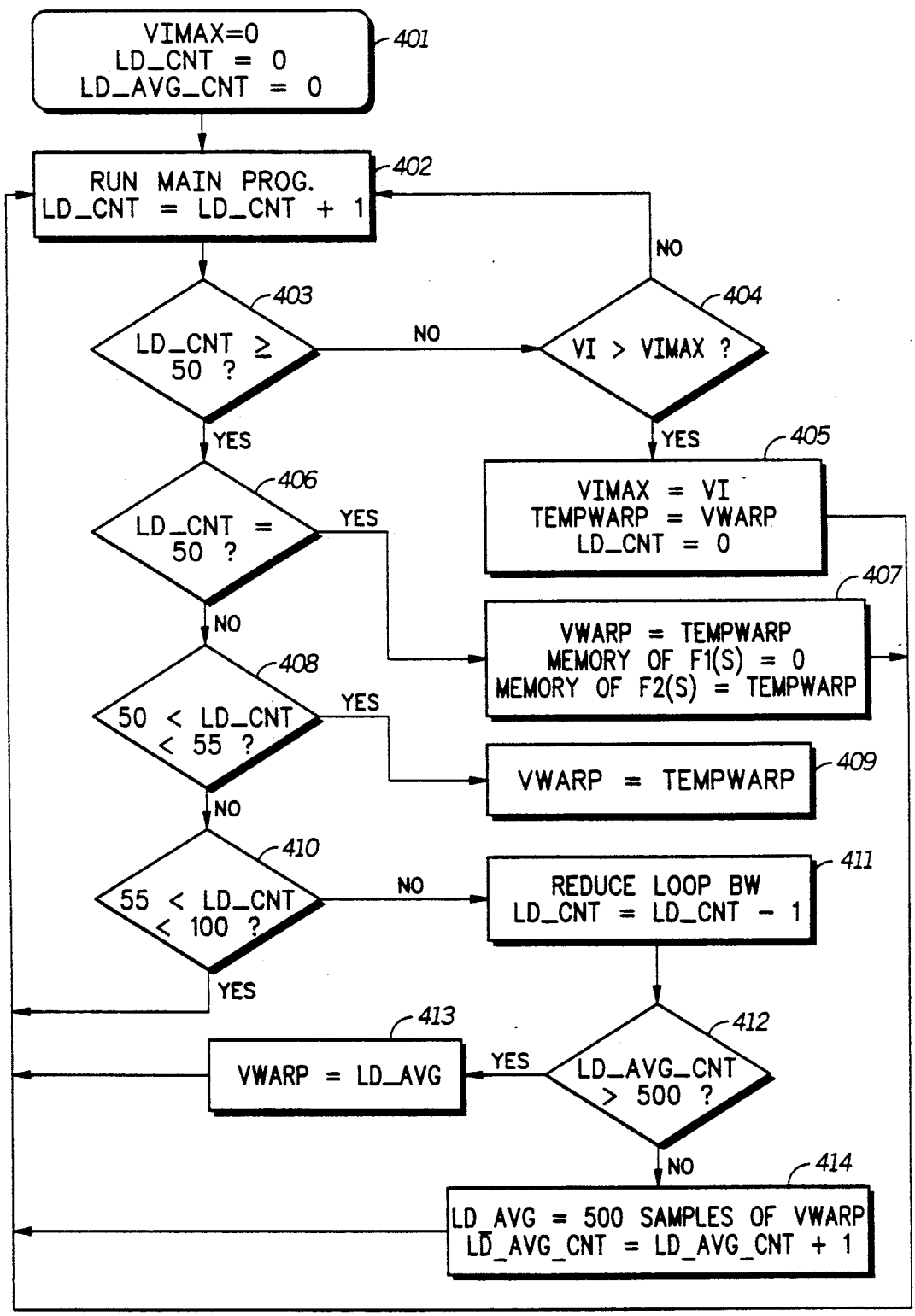
FIG. 3 shows a flowchart of the process of the present invention.

The frequency acquisition algorithm of the present invention is illustrated in FIG. 3. The algorithm is first initialized by setting counter registers LD_CNT and LD_AVG_CNT to zero (401). $V_{imax}$, the maximum value of $V_i(t)$, the integrator output, at the present point in time, is also set to zero. Tempwarp is the new sample of the warp voltage, $V_{warp}$, sampled at the time of $V_{imax}$.

First the PLL in FIG. 1 is run once to get samples of $V_i(t)$ and $V_{warp}(t)$ and the LD_CNT register is incremented by one (402). If fifty samples have not been taken (403), $V_i$ is compared to the last $V_{imax}$ (404). If the current sample is greater, it is stored as the new $V_{imax}$, the new $V_{warp}$ sample is stored as the temporary warp voltage, tempwarp, and the LD_CNT register is set to zero (405). Since the LD_CNT register is set to zero every time a new $V_{imax}$ is found, the process of the present invention will retrieve 50 samples beyond the last maximum value of $V_i$. This greatly reduces the possibility that the last $V_{imax}$ was due to noise.

Figure 4:
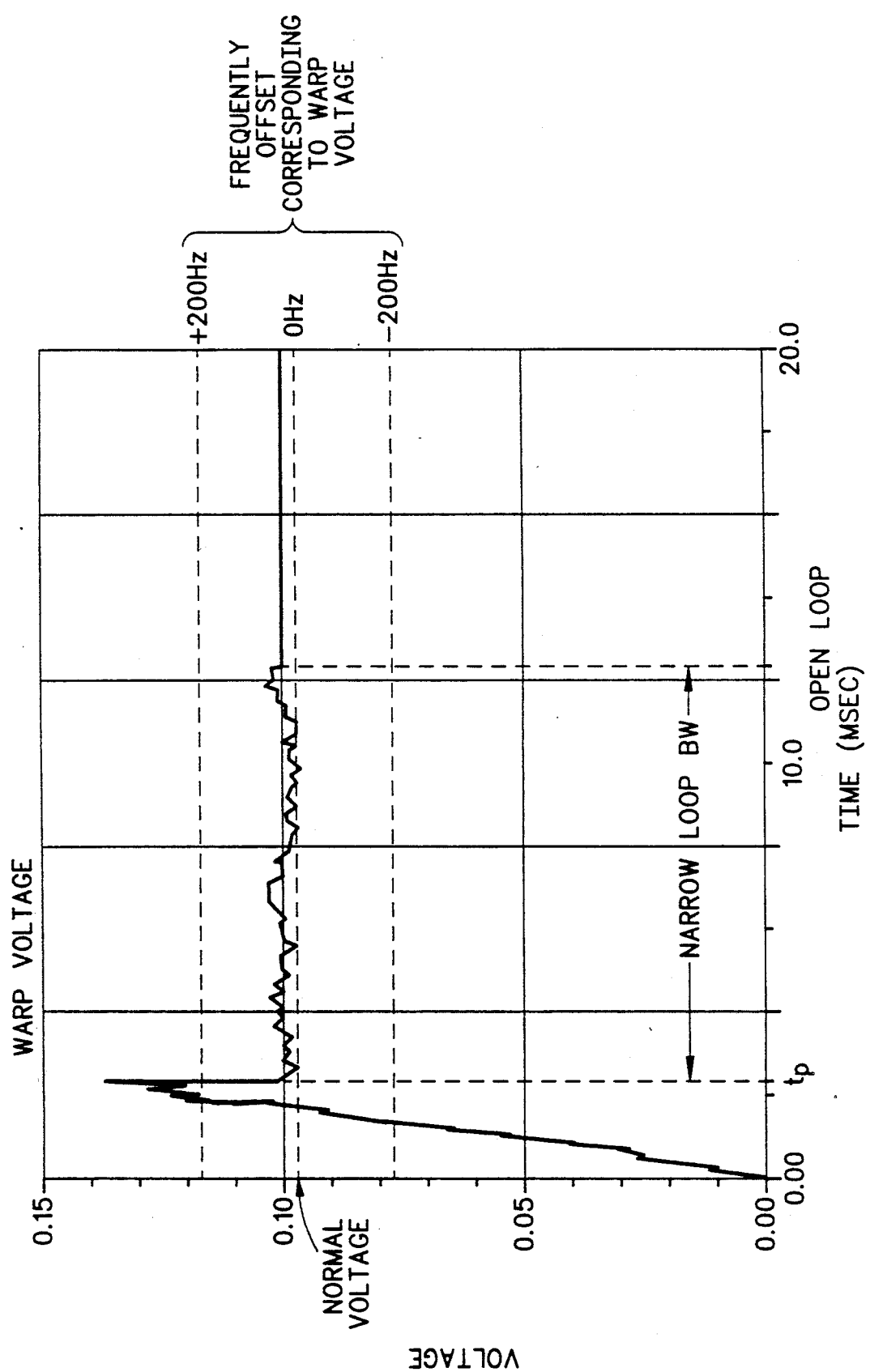
FIG. 4 shows the warp voltage waveform in accordance with the method of the present invention.

Once the process has gone 50 samples past the last $V_{imax}$ (406), that $V_{imax}$ is the peak of the $V_i(t)$ waveform. $V_{warp}$ is now assigned the value of tempwarp (405), causing the sharp drop at $t_p$ illustrated in FIG. 4. Tempwarp is assigned to $V_{warp}$ for the next five times the loop is run (408 and 409). Once the process gets past 100 samples (410), the loop bandwidth is narrowed to attenuate the modulation (411) and $V_{warp}$ is averaged for 500 samples (412 and 414). This is done by incrementing LD_AVG_CNT each time through the process. After LD_AVG_CNT reaches 501, $V_{warp}$ is set equal to the average warp voltage (413), LD_AVG, found during this time and held there. The PLL is now locked onto the proper frequency.

Other methods for finding the peak voltage for $V_i$ can also be used while remaining within the scope of the present invention. Such a method includes differentiating and filtering the detector output to detect the peak. Also, in applications where the detector output is not readily available, the warp voltage driving the VCO could be differentiated and used to detect the peak. If a more common phase error detector was used, the integrating filter is not required. The peak of the phase detector output could be used to reset the warp voltage to its value corresponding to time $t_p$.

In summary, a process for quickly acquiring frequency lock in a PLL has been shown. This is accomplished by setting the VCO's warp voltage equal to the warp voltage that occurred at the same time as the peak phase error.

We claim:

1. A method for frequency acquisition in a phase locked loop having a phase error signal and a voltage controlled oscillator that outputs a variable frequency signal in response to a control voltage, the method comprising the steps of:
    a) detecting a peak voltage, at a time $t_p$, for the phase error signal;
    b) sampling the control voltage at the time $t_p$; and
    c) resetting the control voltage substantially equal to the sampled control voltage at the time $t_p$.

2. The method of claim 1 and further including the steps of reducing the phase locked loop bandwidth, averaging the control voltage for a predetermined time to produce an average control voltage, and setting the control voltage substantially equal to the average control voltage.

3. The method of claim 1 wherein the peak voltage is detected by differentiating the control voltage.

4. A method for frequency acquisition in a phase locked loop having a phase error signal and a voltage controlled oscillator that outputs a variable frequency signal in response to a control voltage, the method comprising the steps of:
    a) detecting a peak voltage, at a time $t_p$, for the phase error signal;
    b) sampling the control voltage at the time $t_p$;
    c) setting the control voltage substantially equal to the control voltage at the time $t_p$;
    d) reducing the phase locked loop bandwidth;
    e) averaging the control voltage for a predetermined time to produce an average control voltage; and
    f) setting the control voltage substantially equal to the average control voltage.

5. A method for frequency acquisition in a phase locked loop having a phase error signal and a voltage controlled oscillator that outputs a variable frequency signal in response to a control voltage, the method comprising the steps of:
    a) resetting a count to zero;
    b) incrementing the count;
    c) sampling a first error voltage, at a time $t_1$, for the phase error signal;
    d) saving the first error voltage;
    e) sampling a first control voltage at the time $t_1$;
    f) saving the first control voltage;
    g) sampling a subsequent error voltage, at a time $t_2$, for the phase error signal;
    h) sampling a second control voltage at the time $t_2$;
    i) comparing the subsequent error voltage to the first error voltage;
    j) if the subsequent error voltage is greater than the first error voltage, saving the subsequent error voltage, the second control voltage, and repeating from step a;
    k) if the count is less than a predetermined count, repeating from step b; and
    l) setting the control voltage substantially equal to the second control voltage.

6. The method of claim 5 and further including the steps of reducing the bandwidth of the phase locked loop, averaging the control voltage for a predetermined time to produce and average control voltage, and setting the control voltage substantially equal to the average control voltage.

* * * * *